US012793687B2

(12) United States Patent
Fedorov

(10) Patent No.: US 12,793,687 B2
(45) Date of Patent: Nov. 10, 2026

(54) SHIELDED BOX FEATURING ULTRASONIC SUPPRESSION OF THE SOUND RECORDING PATH IN AN ENCLOSED ELECTRONIC DEVICE

(71) Applicant: OBSHCHESTVO S OGRANICHENNOJ OTVETSTVENNOST'YU "VELTER", Moscow (RU)

(72) Inventor: Andrej Valer'evich Fedorov, Vlasikha (RU)

(73) Assignee: OBSHCHESTVO S OGRANICHENNOJ OTVETSTVENNOST'YU "VELTER", Moscow (RU)

( * ) Notice: Subject to any disclaimer, the term of this patent is extended or adjusted under 35 U.S.C. 154(b) by 163 days.

(21) Appl. No.: 18/574,394

(22) PCT Filed: Sep. 6, 2021

(86) PCT No.: PCT/RU2021/000382

§ 371 (c)(1),
(2) Date: Dec. 27, 2023

(87) PCT Pub. No.: WO2023/022617

PCT Pub. Date: Feb. 23, 2023

(65) Prior Publication Data

US 2024/0242702 A1 Jul. 18, 2024

(30) Foreign Application Priority Data

Aug. 16, 2021 (RU) ................................ 2021124296

(51) Int. Cl.
*G10K 11/175* (2006.01)
*G10K 11/00* (2006.01)
(Continued)

(52) U.S. Cl.
CPC .......... *G10K 11/1754* (2020.05); *G10K 11/00* (2013.01); *G10K 11/162* (2013.01);
(Continued)

(58) Field of Classification Search
CPC ............. G10K 11/1754; G10K 11/162; G10K 11/175; H04K 3/42; H04K 3/43;
(Continued)

(56) References Cited

U.S. PATENT DOCUMENTS 4,631,641 A * 12/1986 Brombal .............. H05K 9/0016 361/752
4,884,171 A * 11/1989 Maserang ............ H05K 9/0049 361/679.01
(Continued)

FOREIGN PATENT DOCUMENTS

JP 2011187844 A * 9/2011

OTHER PUBLICATIONS

Acoustic safe Skat 5. AKA Catalog Search Equipment, 2020, p. 13. https://aka-md.com/Images/D5%20Catalog_RU.pdf.
(Continued)

*Primary Examiner* — Carolyn R Edwards
*Assistant Examiner* — Julie X Dang
(74) *Attorney, Agent, or Firm* — Rivka Friedman

(57) ABSTRACT

This invention is an electrical engineering solution designed to safeguard against espionage by jamming electronic recording devices. It features a conductive aluminium box housing an ultrasonic jammer that neutralizes smartphone microphones and voice recorders. The jammer, powered by a battery and comprising an ultrasonic generator and three emitters, produces a radiation pattern aimed at an enclosed electronic device to disrupt its recording capabilities. The device operates autonomously, emitting ultrasonic waves at 24-26 kHz, and offers a minimum of 60 db shielding from
(Continued)

30 MHz to 6 GHz. It effectively blocks GPS/GLONASS, GSM/3G/4G/5G, Wi-Fi, Bluetooth, and NFC interfaces, thus controlling communication and preventing mobile devices' built-in recording functions.

11 Claims, 16 Drawing Sheets

(51) Int. Cl.
*G10K 11/162* (2006.01)
*H05K 9/00* (2006.01)
*H10W 42/20* (2026.01)
*H10W 44/20* (2026.01)

(52) U.S. Cl.
CPC ............... *H05K 9/00* (2013.01); *H10W 42/20* (2026.01); *H10W 44/20* (2026.01)

(58) Field of Classification Search
CPC ........ H04K 3/68; H04K 3/90; H04K 2203/12; H04K 2203/16; H04K 2203/18; H04K 2203/34; G06F 3/017; G06F 3/041; G06F 3/165; H04L 12/2812; H04L 12/282; H04L 65/1101; H04L 67/306; H04R 1/403; H04R 1/406; H04R 27/00; H04R 3/005
See application file for complete search history.

(56) References Cited

U.S. PATENT DOCUMENTS

| | | | | |
|---|---|---|---|---|
| 10,643,596 | B2 | 5/2020 | Fong et al. | |
| 2004/0234080 | A1* | 11/2004 | Hemandez ....... | G10K 11/17821 381/71.11 |
| 2010/0200288 | A1* | 8/2010 | Cochrane ............. | H05K 9/0049 174/384 |
| 2015/0104026 | A1* | 4/2015 | Kappus ................ | G10K 11/175 381/63 |
| 2015/0282299 | A1* | 10/2015 | Shi ........................ | H10W 44/20 174/250 |
| 2018/0027708 | A1 | 1/2018 | Kawaguchi et al. | |
| 2019/0103371 | A1* | 4/2019 | Morton ................. | H10W 44/20 |
| 2020/0139902 | A1* | 5/2020 | Furuzawa ............... | B60R 13/08 |
| 2020/0265825 | A1* | 8/2020 | Fong ....................... | G10L 25/51 |

OTHER PUBLICATIONS

Acoustic safe "SKAT-5"; AP Security https://apsecurity.ru/products/safes/akusticheskij-sejf-skat-5.
Block a capsule that will silence the phone Sep. 23, 2020 https://web.archive.org/web/20200923051035/https://crowdpublishing.ru/block/.
International Search Report for PCT/RU2021/000382 Mailed May 19, 2022.

* cited by examiner

SHIELDED BOX FEATURING ULTRASONIC SUPPRESSION OF THE SOUND RECORDING PATH IN AN ENCLOSED ELECTRONIC DEVICE

TECHNICAL FIELD

The invention relates to the protection of information against unauthorized access and protection of devices transmitting information over radio channels and acoustic channels.

PRIOR ART

A smartphone security masking enclosure is known from the prior art (U.S. Pat. No. 9,336,768B2 published on May 10, 2016). This known mobile phone security masking enclosure contains a sound insulated enclosure for use as a temporary storage location for cellular and other mobile devices in locations at which confidential and sensitive conversations and discussions are being conducted. The device, which generates pink/white noise within the enclosure, produces a masking noise so that the cellular or other mobile devices within the enclosure cannot pick up or record conversations outside the enclosure. The device also contains an acoustic noise generator placed within the enclosure, and the said acoustic noise generator contains a multitude of individual noise generators, with each of these individual noise generators generating noise.

The technical solutions implemented in that invention do not allow achieving the technical result achieved by the present invention, because such enclosure is not shielded and lets the electromagnetic radiation pass through, and also because the device generates white noise, which fails to completely suppress the sound recording device.

An apparatus made in the form of housing comprising two housing portions, with the internal housing portion being designed to receive and enclose one or more personal communication devices; wherein the housing is made from material that absorbs the sound; and contains a noise generator to ensure the uncorrelated noise streams, is known from the prior art (U.S. Ser. No. 10/878,795B2 published on Feb. 20, 2020).

The technical solutions implemented in that invention do not allow achieving the technical result achieved by the present invention, because such housing is not shielded and lets the electromagnetic radiation pass through, and also because the device generates white noise, which fails to completely suppress (isolate) the sound recording or electronic device.

An electronic device storage container is known from the prior art (U.S. Ser. No. 10/818,280B2 published on Mar. 19, 2020). This known electronic device storage container includes a base, perimeter sidewalls extending upwardly from it to form an interior volume, and a lid affixed with a hinge to one sidewall. The housing of electronic components is placed within the internal volume and includes a power source operationally connected to a white noise generator, a photosensor, a multitude of USB ports, an internal speaker, an external speaker, a fan, a volume control, a lid interlock switch, and one or more external LEDs. The housing may include layers of soundproofing material. The white noise generator emits a sound signal to prevent the microphone of the stored electronic device from recording conversations or other sounds. The photosensor detects when the electronic device receives an incoming transmission, and the external speaker notifies the user of the incoming transmission.

The technical solutions implemented in that invention do not allow achieving the technical result achieved by the present invention, because such housing is not shielded and lets the electromagnetic radiation pass through, and also because the device generates white noise, which fails to completely suppress (isolate) the sound recording or electronic device.

SUMMARY OF THE INVENTION

The task addressed by the claimed technical solution is the creation of a device that ensures the passive blocking of electromagnetic field in order to control the communications of mobile devices, as well as ensures the active blocking of any sound recording device built into the mobile device.

The technical result of the claimed technical solution is the shielding of electromagnetic field in order to control the communications of mobile devices, as well as the blocking of any sound recording device built into the mobile device.

The technical result of the claimed invention is achieved by means of the shielded box featuring the ultrasonic suppression of the sound recording path in an enclosed electronic device, which contains the body of the box made of electrically conductive material and of two parts, wherein the parts of the body are sealed and connected to each other to ensure electrical contact via a copper spring strip fixed to one part of the body, ultrasonic suppressor of microphones in smartphones and voice recorders of an electronic device made in a separate enclosure and enclosed in the body of the box, wherein the said ultrasonic suppressor is designed to have three channels, wherein each channel contains an ultrasonic generator and an ultrasonic emitter, and the said ultrasonic emitters are arranged so that the radiation pattern of the said ultrasonic emitters is directed at the electronic device enclosed in the shielded box containing a sound recording device, and each channel of the ultrasonic suppressor is designed to allow modulating its frequency.

In a particular embodiment of the claimed technical solution, each channel of the ultrasonic suppressor is designed to allow modulating its frequency in the range of 100 Hz-500 Hz.

In a particular embodiment of the claimed technical solution, the ultrasonic suppressor of microphones in smartphones and voice recorders of an electronic device is designed as an autonomous unit.

In a particular embodiment of the claimed technical solution, the ultrasonic suppressor is designed to allow generating interference in the form of ultrasonic waves at a frequency of 24 kHz-26 KHz.

In a particular embodiment of the claimed technical solution, the shielded box is designed with a shielding efficiency of at least 60 dB in the frequency range of 30 MHz-6 GHZ.

In a particular embodiment of the claimed technical solution, it is designed to allow blocking the following interfaces: GPS/GLONASS; GSM/3G/4G/5G; Wi-Fi; Bluetooth; NFC.

In a particular embodiment of the claimed technical solution, the body of the box is made of an electrically conductive material with a current penetration depth of no more than 0.0026 mm at a frequency of 1 GHz with a wall thickness of at least 1.5 mm.

In a particular embodiment of the claimed technical solution, the copper spring strip is fixed by of conductive glue or conductive adhesive tape.

In a particular embodiment of the claimed technical solution, the spring strip is designed as a profiled strip with spring-loaded lamellae made of copper and beryllium.

In a particular embodiment of the claimed technical solution, a plastic cup and/or an insert made from a sound-absorbing material is additionally installed within the body of the box.

In a particular embodiment of the claimed technical solution, an acoustic membrane made of no more than 3 mm thick elastomeric or vibration-insulating material based on polyurethane is used as the sound-absorbing material.

In a particular embodiment of the claimed technical solution, the body of the box has a built-in EMC filter for data and power transmission, which prevents interference through cable conductors or holes in the shield (box). The filter has USB-C input ports on the outside of the box and USB-C output ports on the inside of the box.

In a particular embodiment of the claimed technical solution, the ultrasonic suppressor of microphones in smartphones and voice recorders of an electronic device additionally includes a wireless charging transmitter with a wireless charging controller and induction transmission coil connected to the said wireless charging controller.

BRIEF DESCRIPTION OF THE DRAWINGS

The details, features, and advantages of this invention can be seen below in the description of embodiments of the claimed technical solution provided along with the drawings that show the following:

Figure 1:
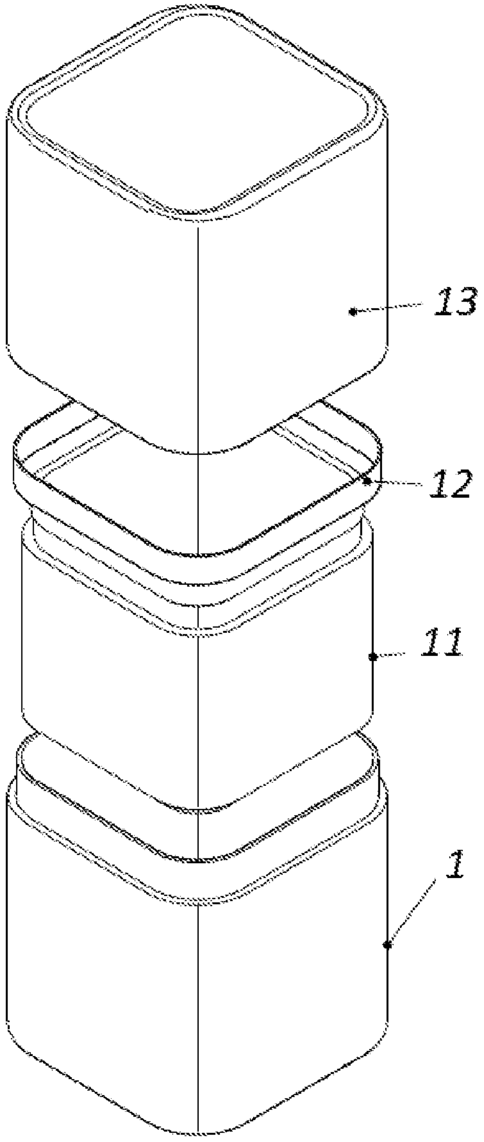
FIG. 1 shows the general view of the shielded box with a built-in ultrasonic suppressor of sound recording equipment.
Figure 2:
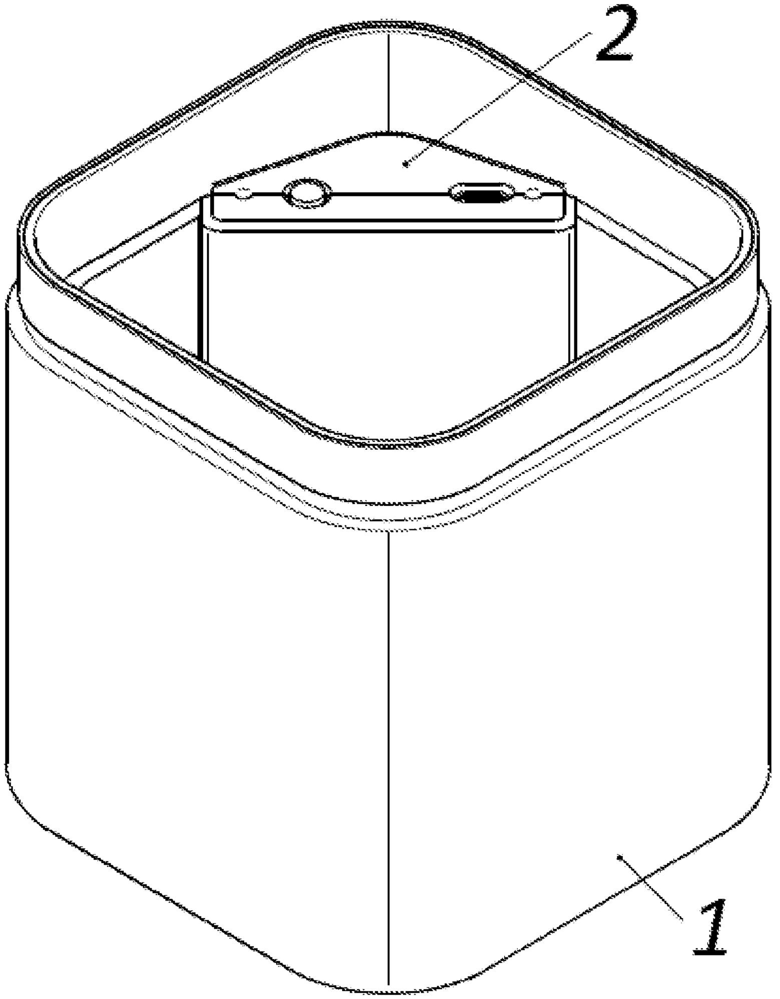
FIG. 2 shows the general view of the shielded box with a built-in ultrasonic suppressor of sound recording equipment.
Figure 3:
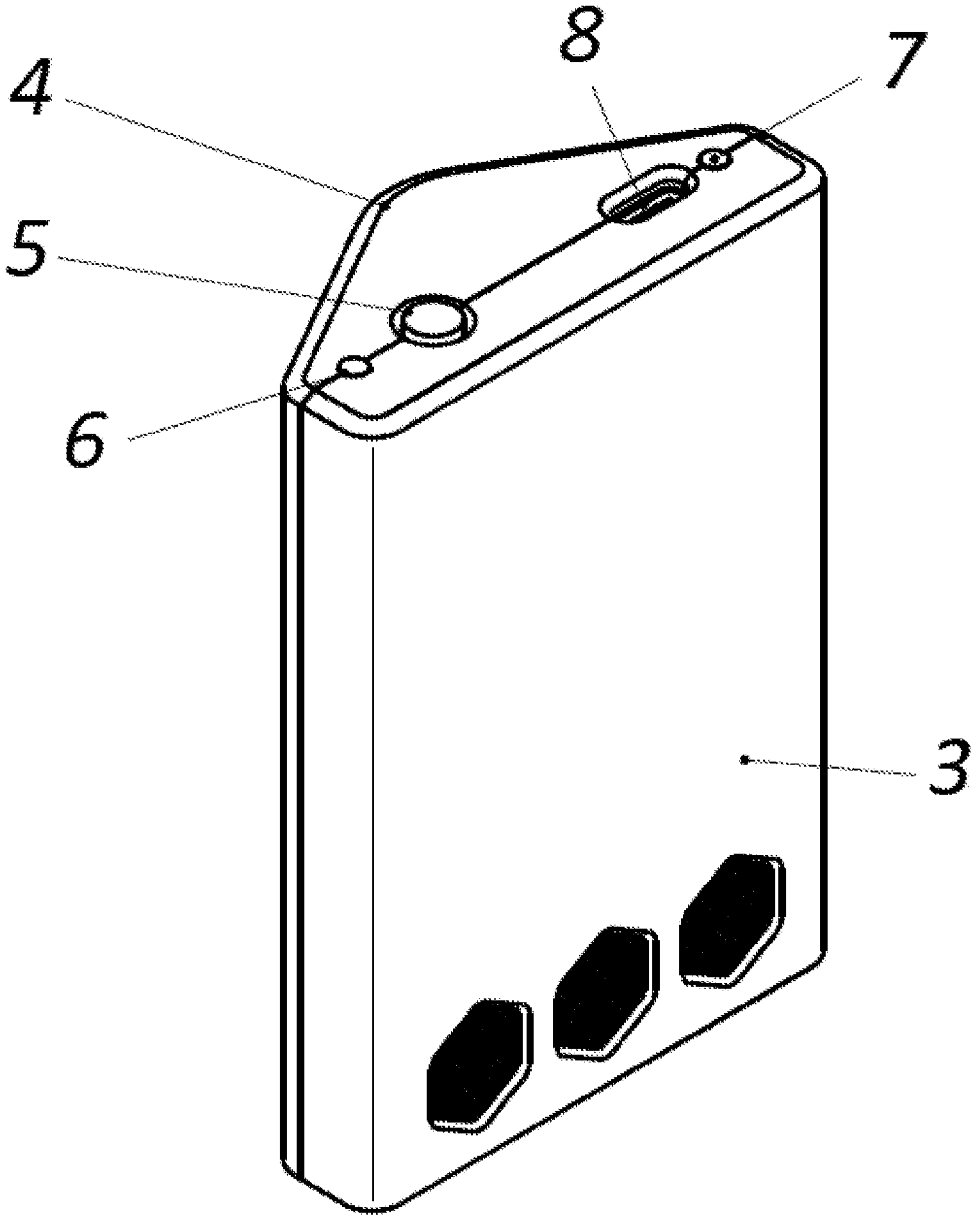
FIG. 3 shows the general view of the ultrasonic suppressor of sound recording equipment.
Figure 4:
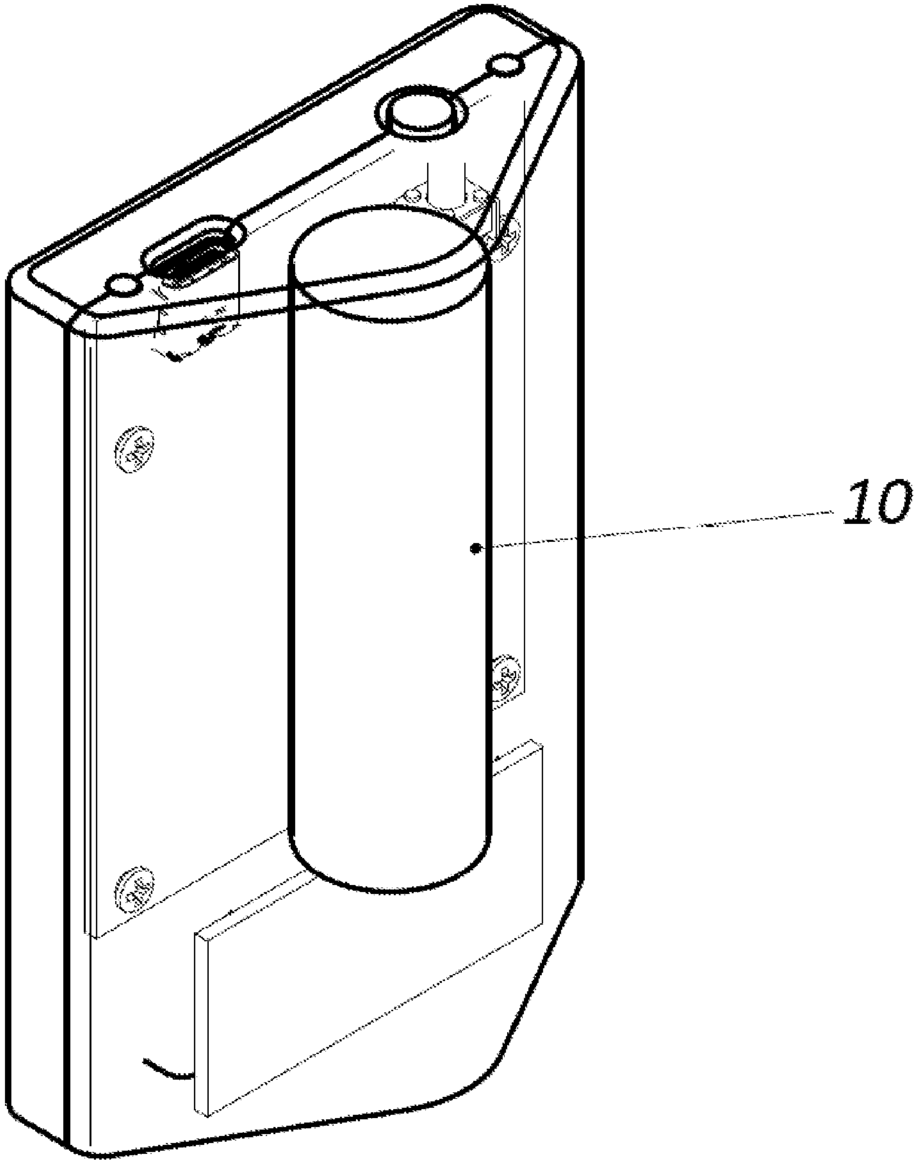
FIG. 4 shows the position of the battery in the ultrasonic suppressor of sound recording equipment.
Figure 5:
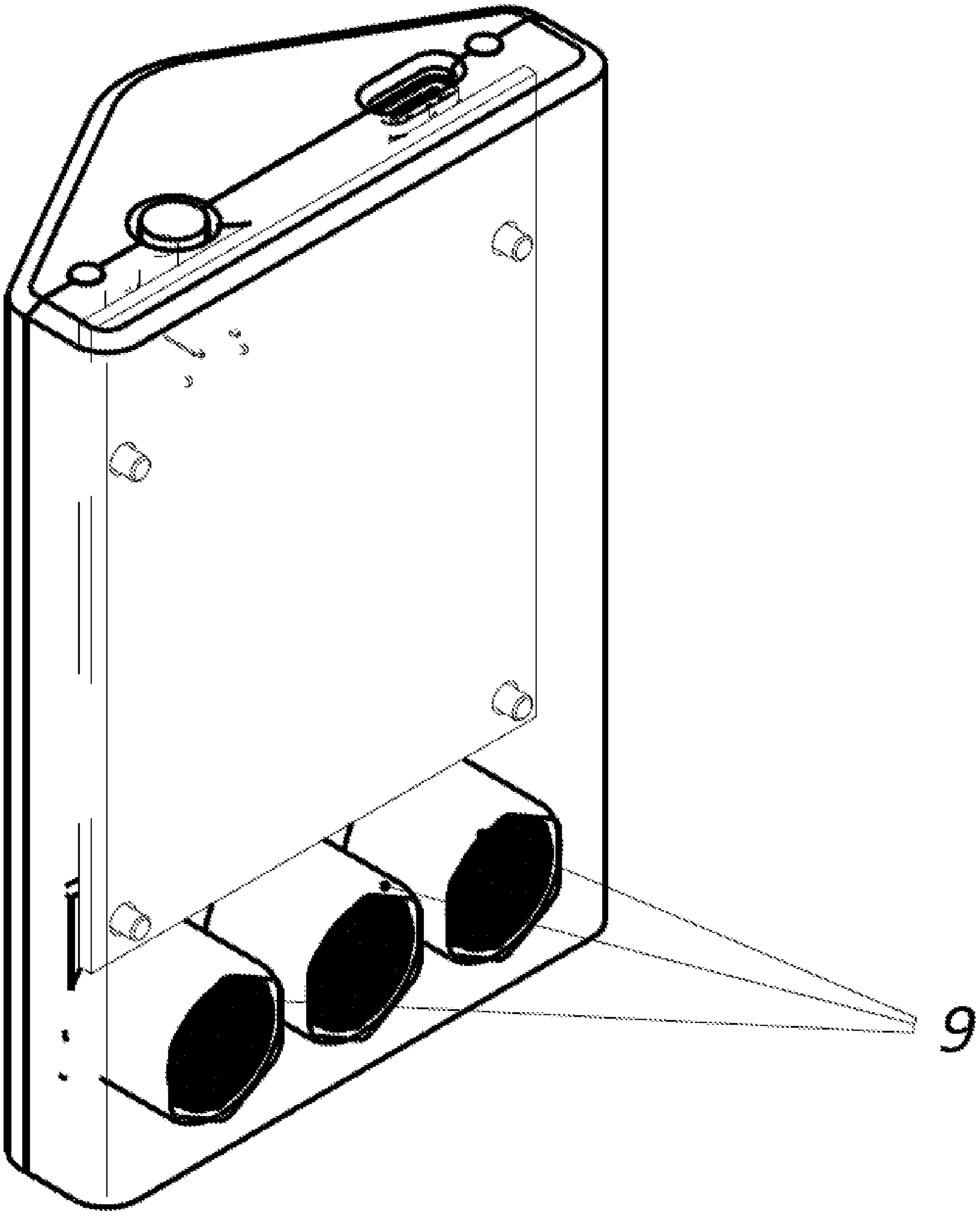
FIG. 5 shows the position of ultrasonic emitters in the ultrasonic suppressor of sound recording equipment.
Figure 6:
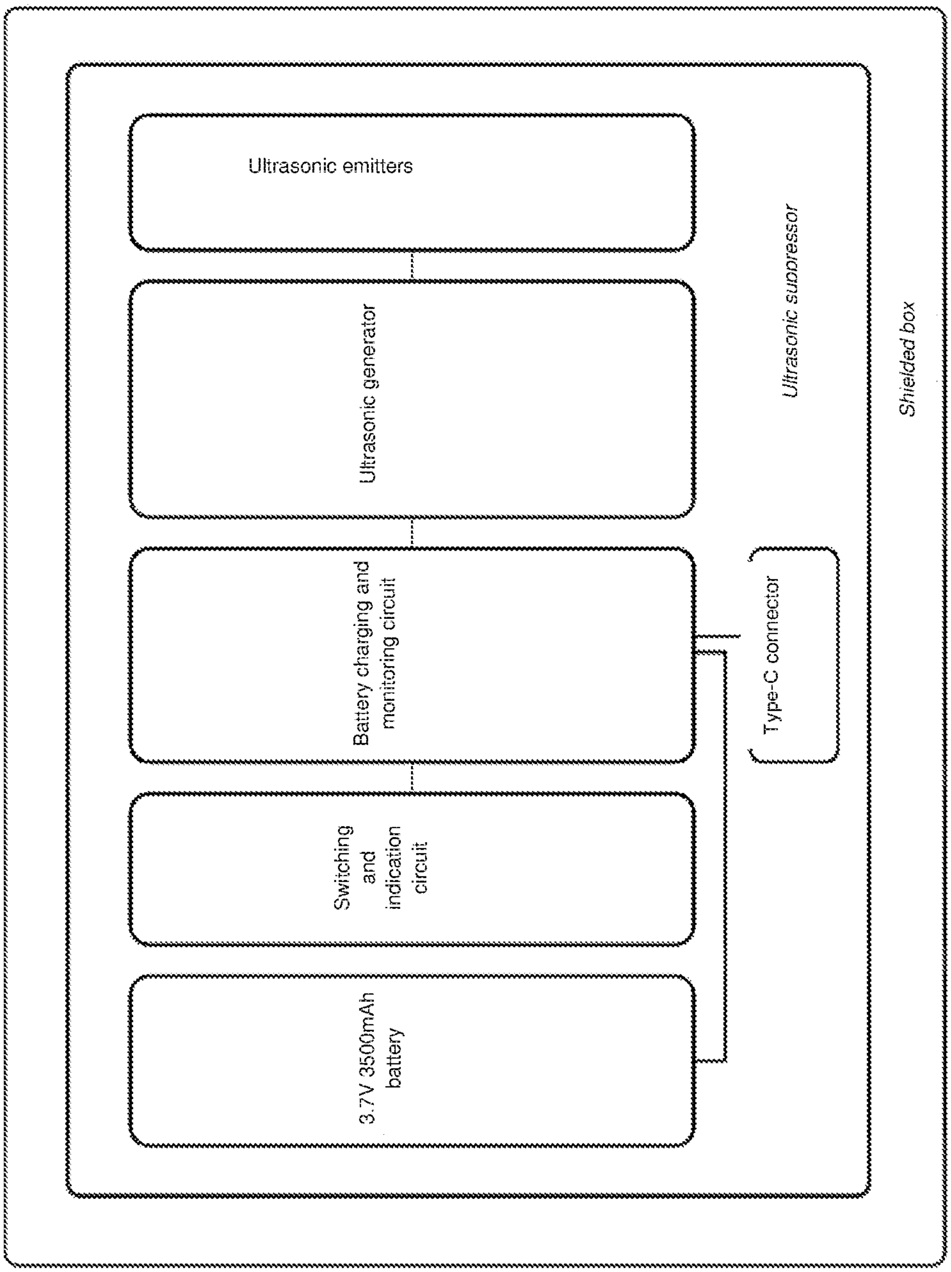
FIG. 6 shows schematic block diagram of the device.
Figure 7A:
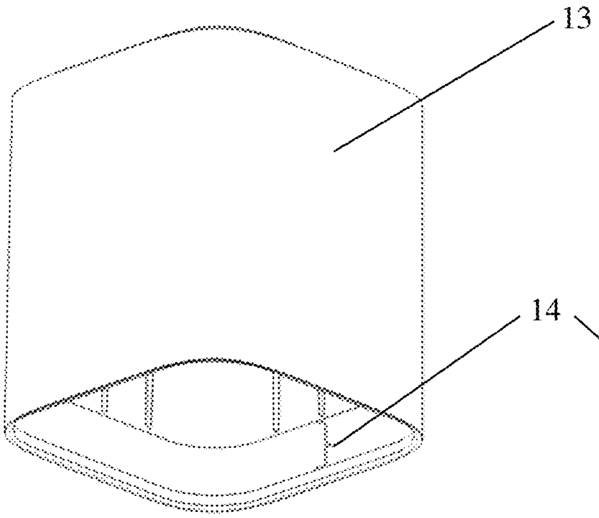
FIGS. 7(*a*) and 7(*b*) shows bottom perspective and exploded view of the head of the box.
Figure 7B:
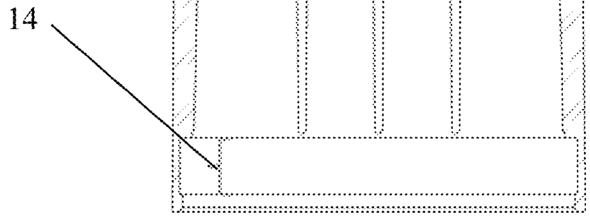
Figure 8:
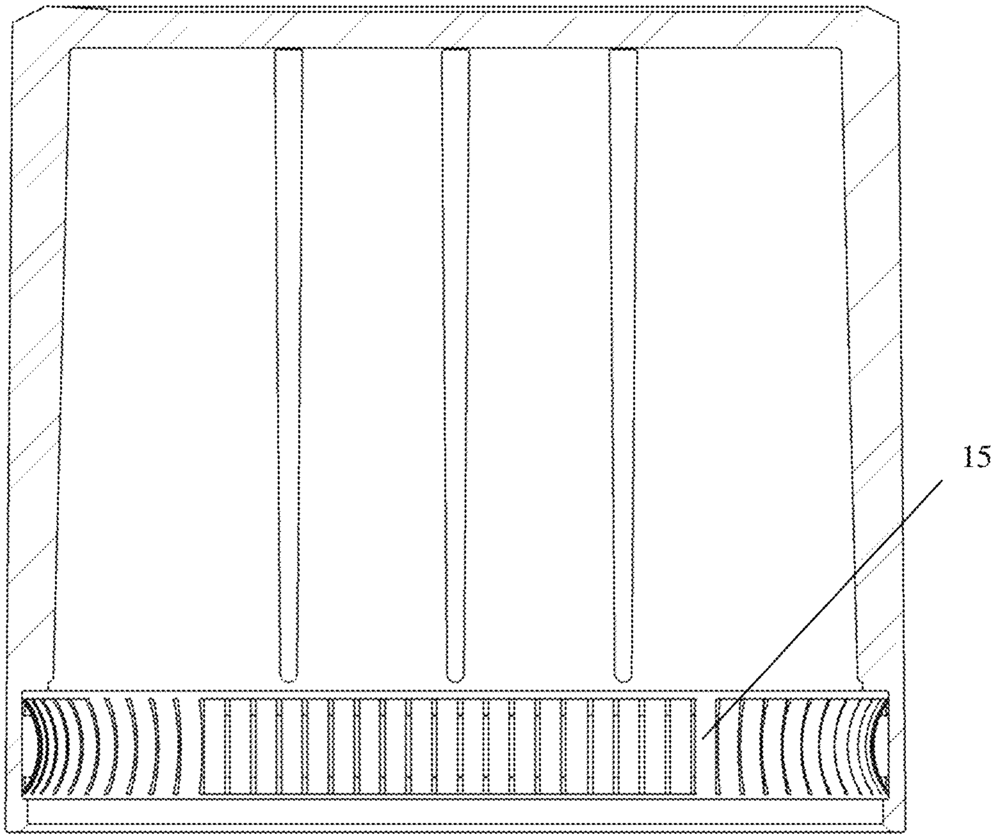
FIG. 8 shows sectional view of spring band inside the slot associated with the head of the box of FIGS. 7(*a*) and 7(*b*).
Figure 9:
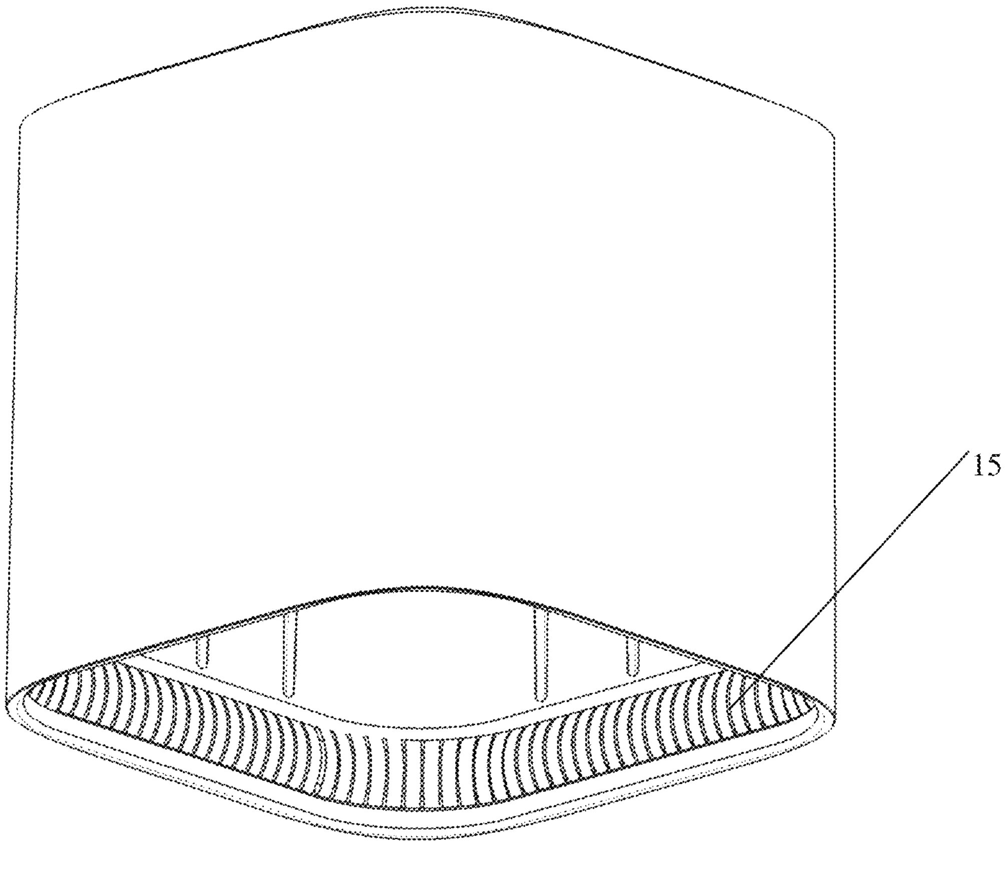
FIG. 9 shows spring band inside the slot.
Figure 10:
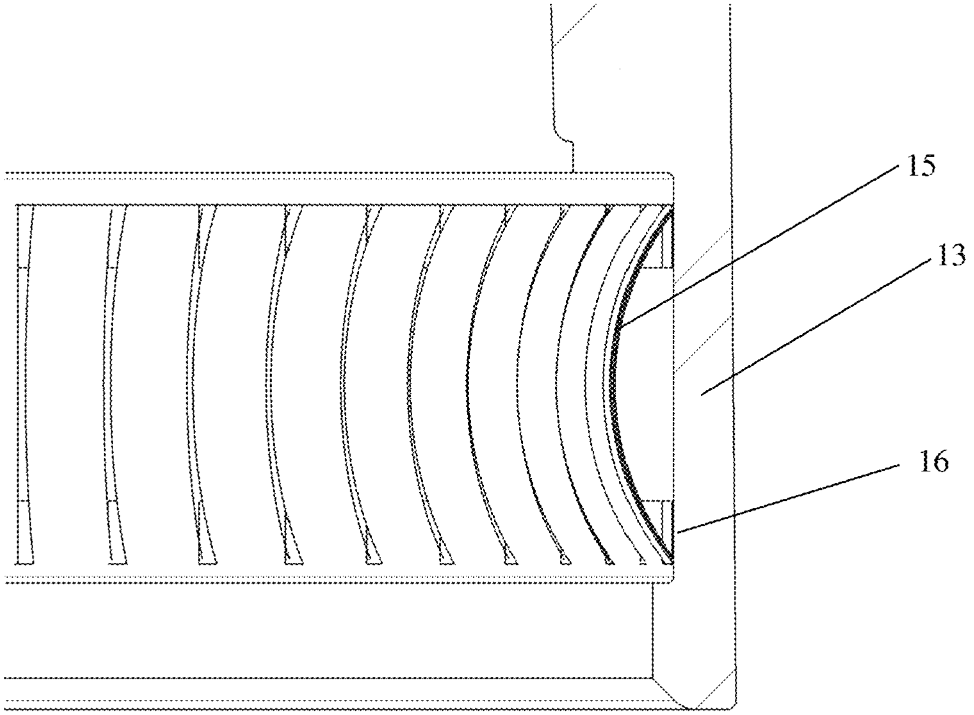
FIG. 10 shows an enlarged view of the spring band inside the slot of the top part of the box is fixed with conductive glue.
Figure 11:
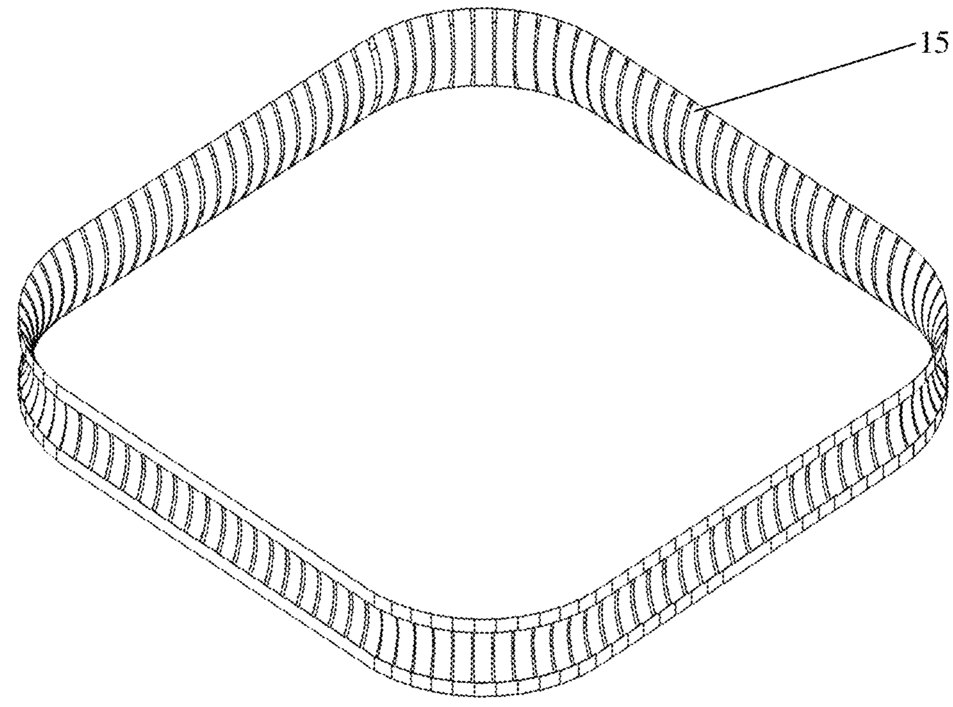
Figure 12:
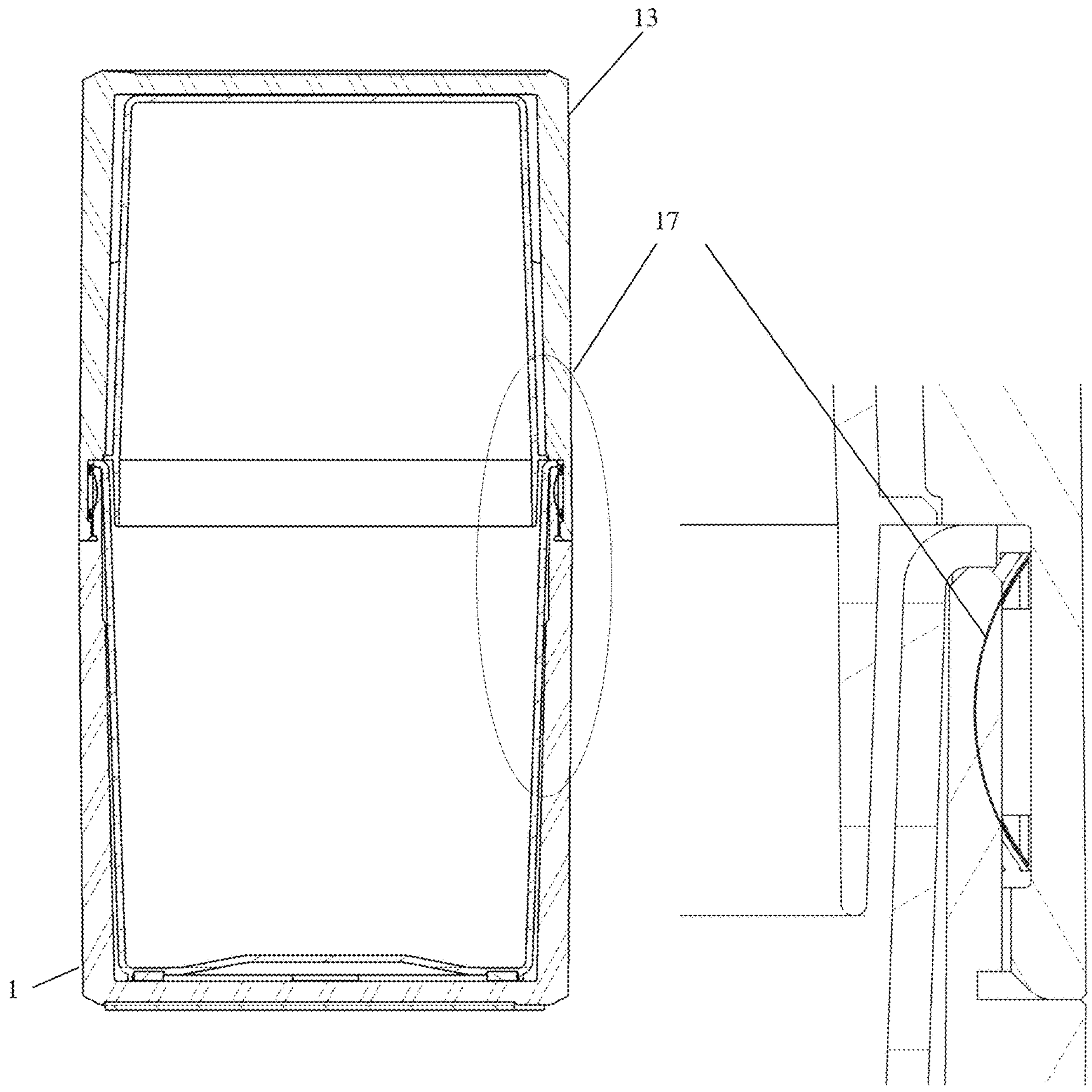
Figure 13:
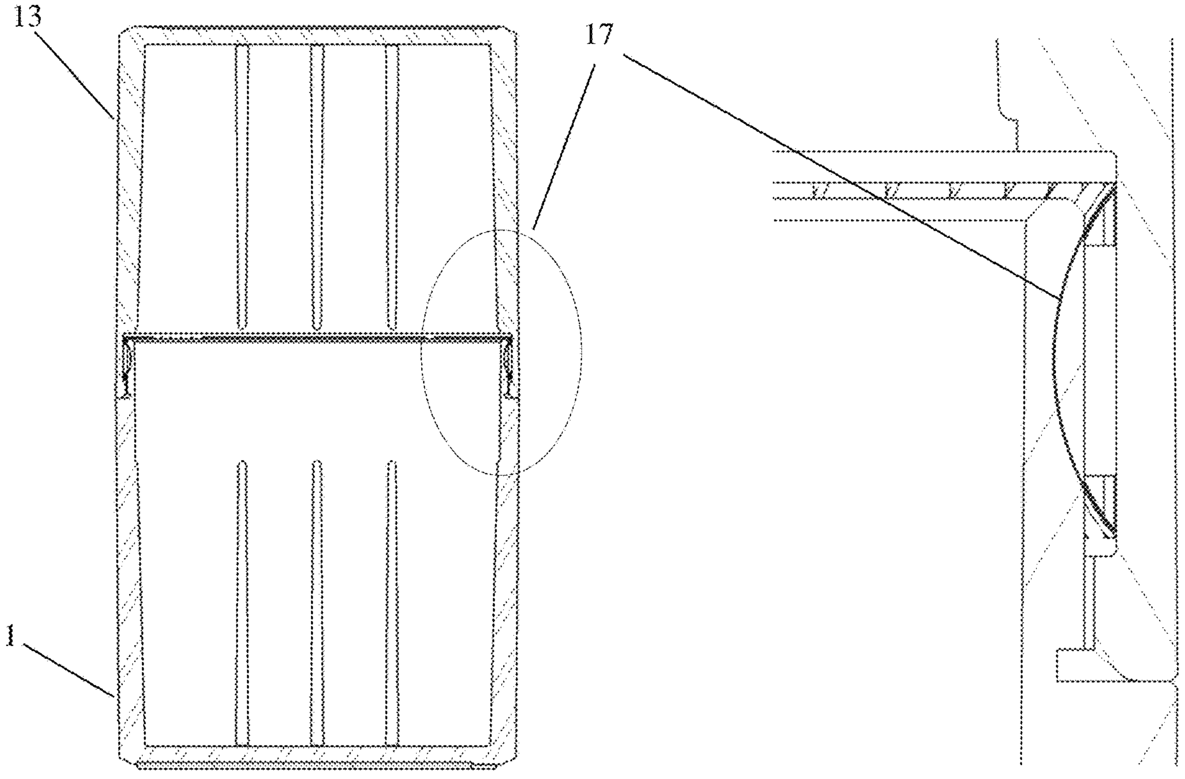
Figure 14A:
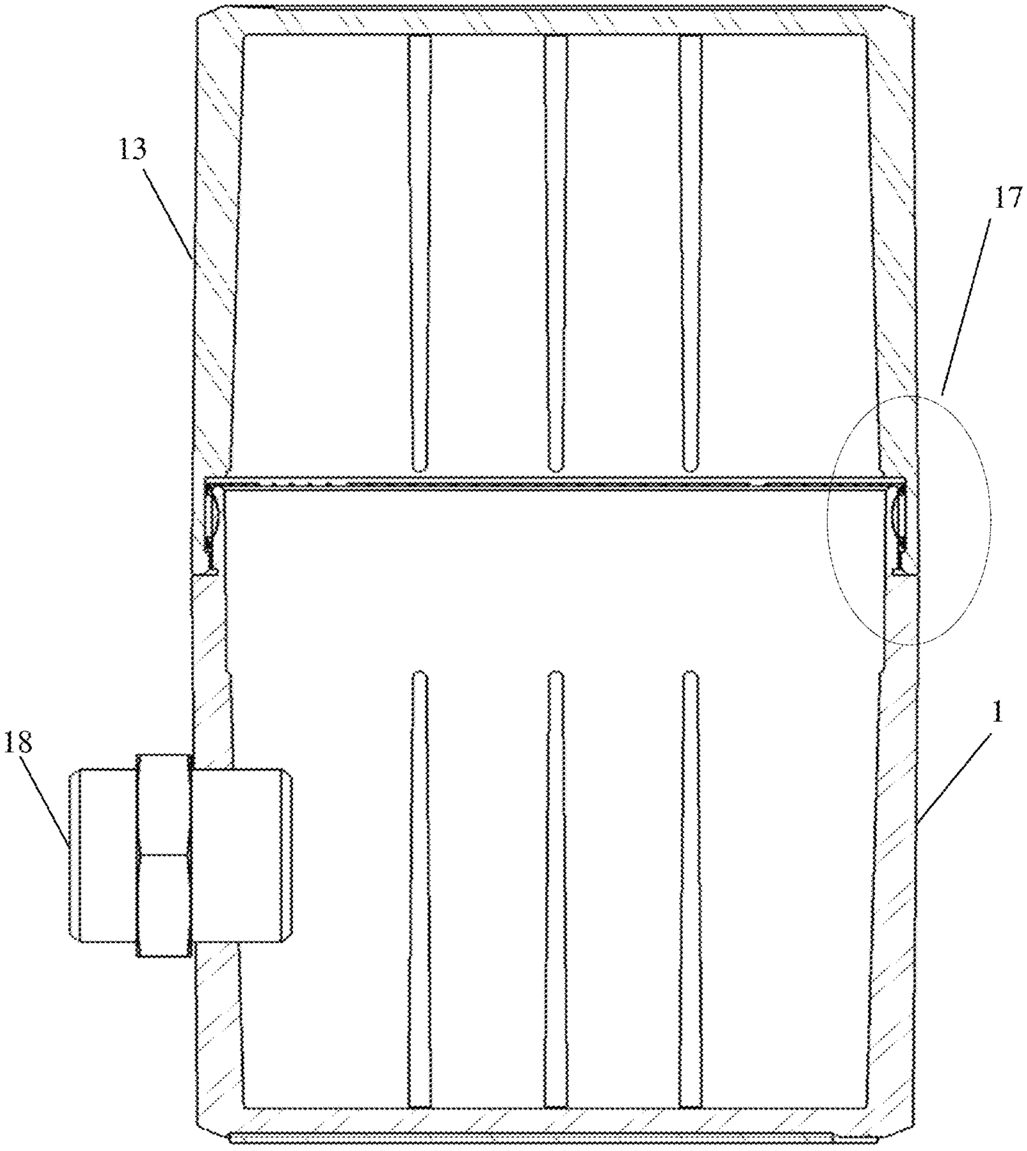
Figure 14B:
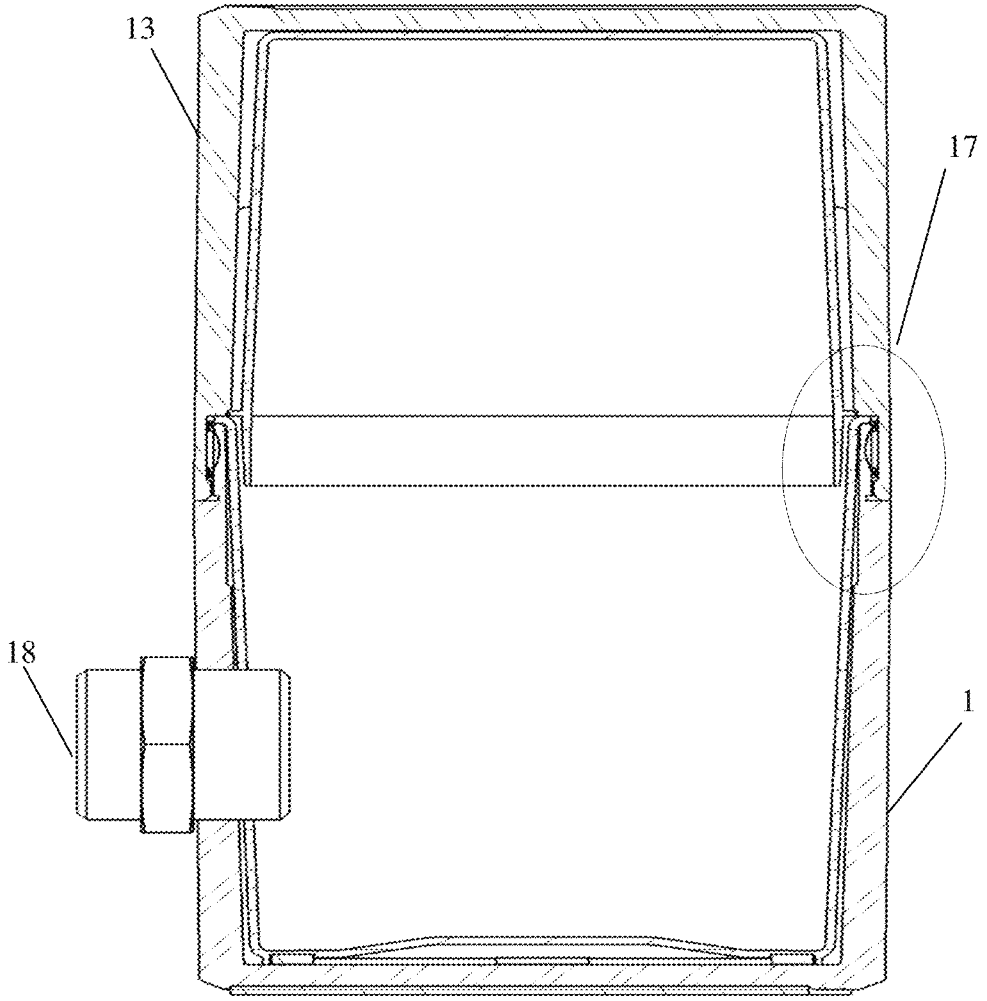
Figure 15:
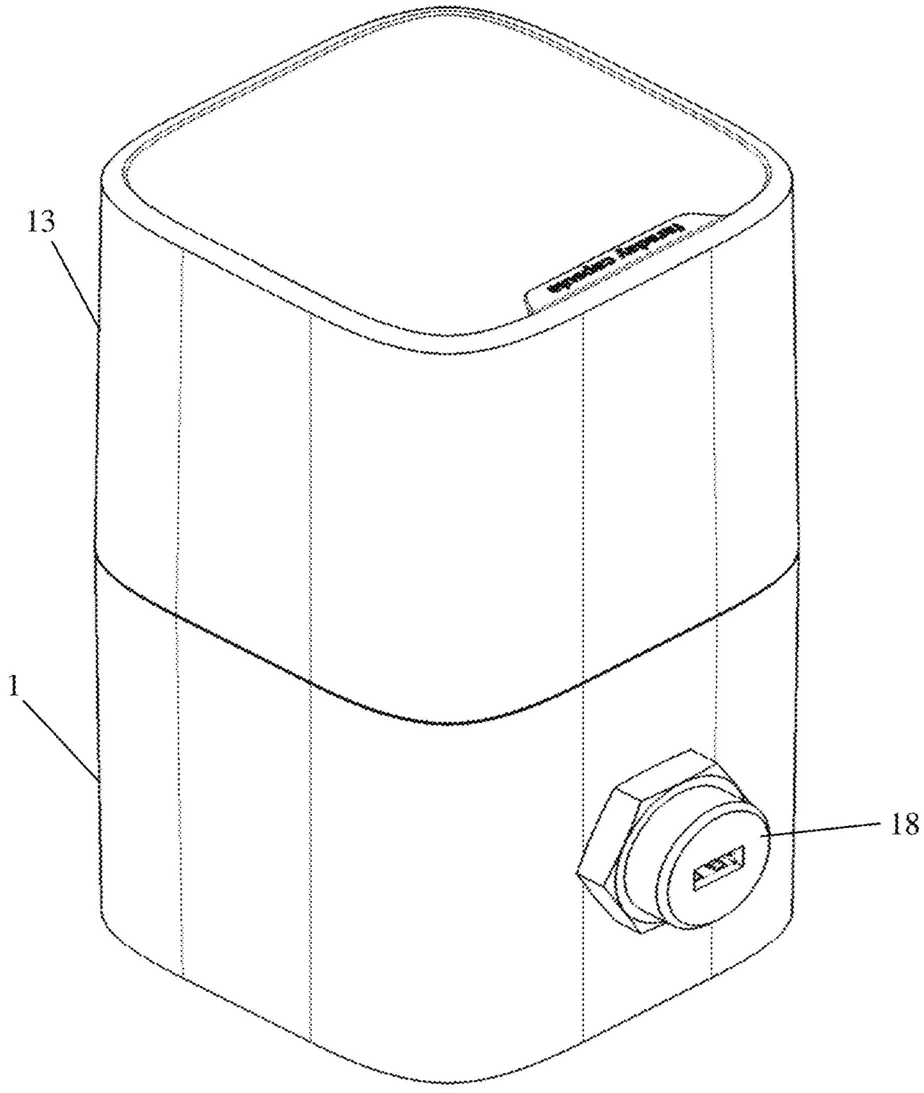

Numbers in the figures indicate the following items:

1—bottom part of the box; 2—ultrasonic suppressor; 3—body of the insert; 4—lid of the insert; 5—button; 6—operation indicator; 7—charge indicator; 8— USB-C; 9—ultrasonic emitters; 10—battery; 11—plastic cup; 12—conductive connector; 13—head of the box.

SUMMARY OF INVENTION

The shielding box is a closed shielded body that blocks outgoing and incoming radio signals of mobile devices in the range of 30 MHz-6 GHz with a shielding efficiency of at least 60 dB. An autonomous ultrasonic suppressor of sound recording equipment is placed within the shielded box.

The claimed technical solution is made in the form of a box with a vertically opening upper (13) part of the body designed as its head. It can accommodate 5-8 telephones depending on their size. A conductive connector (12) made in the form of a bronze spring strip fixed by a conductive glue or conductive adhesive tape is used to tighten the connection and secure the electrical contact between the top (13) and bottom (1) parts of the box. The spring strip is designed in the form of a profiled strip with spring-loaded lamellae made of copper (copper and beryllium) laid along the connection contour of the box parts. This design allows to preserve the shielding properties of the body at the necessary level and reliably maintain the box in its closed state. To install the spring strip, a slot for securing the copper spring strip is made in the body.

The fact that the spring strip is made from an alloy of copper with beryllium has a beneficial effect on the reliability of electrical contact between the parts of the box, since BrB2 alloy is neutral to many aggressive environments, such as acid and alkaline solutions, sea and fresh water. In addition, the use of this material for the connector (12) is determined by its mechanical hardness, wear resistance, durability and resistance to corrosion and abrasion.

An electrical contact between the top (13) and bottom (1) parts of the box is required to create an electrically closed and electrically sealed shielded structure (Faraday Cage). The use of copper strip allows to repeatedly open and close the box without deteriorating its shielding efficiency.

The said design enables confident preservation of the closed electromagnetic circuit created by the enclosure in the closed state.

The box, its bottom and top parts are made of electrically conductive material with AC penetration depth $\delta$ of no more than 0.0151 mm at a frequency of 30 MHz and no more than 0.0026 mm at a frequency of 1 GHz. This applies both to the material of the body and to the material of structural elements that connect the body.

Such materials may be aluminum alloys (like AMg), which allow die casting and pressure casting.

The walls should be at least 1.5 mm thick. A plastic cup is installed within the box (11) to protect smartphones from damage against the walls of the box. An additional cup made of sound-absorbing material can be installed within the plastic cup. An acoustic membrane made of no more than 3 mm thick elastomeric or vibration-insulating material based on polyurethane is used as the sound-absorbing material.

Such sound-absorbing cup can be installed directly in a shielded box without a plastic cup.

This design of a shielded box completely shields the electromagnetic field of mobile communication devices enclosed in the box and ensures acoustic blocking.

Electronic mobile devices containing any sound recording equipment are placed within the box that has an inserted plastic cup (11), the box also accommodates such autonomous module as an ultrasonic suppressor (2) of microphones in smartphones and voice recorders. A smaller wall thickness would fail to ensure sufficient rigidity of the design and may diminish shielding efficiency.

The following describes the design of ultrasonic suppressor (2) of sound recording equipment, such as, the microphones in mobile phones, smartphones and voice recorders:

The ultrasonic suppressor of sound recording equipment in smartphones and voice recorders is an ultrasonic interference generator that produces ultrasonic waves at a frequency of 24-26 kHz and interferes with the amplification path of the sound recording equipment in a mobile device and causes the microphone amplifier to switch into a non-linear mode, thereby making it impossible to record any useful signal (sound).

The method of ultrasonic suppressor's interference with the amplification path of sound recording equipment is dynamic, repetitive, and pseudo-random, with signals generated at the frequencies of 24-26 kHz.

Ultrasonic waves at a frequency of 25 kHz and an amplitude of at least 60 Volts are modulated by various frequencies in the range of 100-500 Hz and then fed to ultrasonic emitters.

The ultrasonic suppressor uses 3 channels. Each channel is modulated at its own frequency in the range of 100-500 Hz. Each channel is an individual ultrasonic frequency generator with a modulating signal and individual ultrasonic emitter.

For effective interference with the sound recording equipment, the ultrasonic suppressor must have the power of at least 105 dBm (with such power measured at a distance of 1 m). A high level of power is also required to ensure the most efficient suppression at a sufficient distance from the sound recording equipment.

The advantage of dynamic ultrasonic interference is its high efficiency when using this method in the attempts to decrypt a recorded audio file by generating a pseudo-random noise signal.

In this mode, the modulating carrier frequencies penetrate directly to the analog signal converter of a device and, therefore, the sound recording equipment can reproduce only these modulating frequencies, because their amplitude is much larger than the one of any incoming signal outside the interference of ultrasonic suppressor. As a result, the recording of any useful signal becomes impossible.

At the hardware level, the implementation of this method involves developing an ultrasonic frequency generator, which can be fine-tuned and also has a function of introducing a modulating frequency. The frequency fine-tuning is required to adjust the resonance frequency of ultrasonic emitters. The ultrasonic emitters must be selected in such a way that they can reproduce the signal with the maximum amplitude to ensure the best interference with the sound recording equipment.

The ultrasonic suppressor (2) of sound recording equipment can be used both within the said shielded box or separately or in any other shielding (closed) product designed for storing the mobile equipment.

The ultrasonic suppressor of sound recording equipment is designed with three ultrasonic emitters (9) positioned on the front of the device.

The ultrasonic emitters are arranged in such a way that the radiation pattern of the said ultrasonic emitters is directed at the electronic device enclosed in the shielded box containing a sound recording device.

A minimum of 3 emitters is needed to achieve the required suppression factor for the sound recording equipment.

In an embodiment of the claimed technical solution, the ultrasonic suppressor (2) of the sound recording equipment additionally includes a wireless charging transmitter with a wireless charging controller and induction transmission coil connected to the said wireless charging controller.

This embodiment of the technical solution allows to implement the wireless charging of mobile devices and suppression of sound recording equipment.

The ultrasonic suppressor (2) of sound recording equipment can be switched on/off by pressing a button and has a built-in battery (10), which enables autonomous operation for up to 4 hours and can be charged via a Type-C connector (8). The indicators showing the operation of the device are provided by LEDs. The power is supplied by the built-in battery with a capacity of 3500 mAh.

The ultrasonic suppressor (2) of microphones in smartphones and voice recorders includes the following elements: Type-C connector (8) to charge the device via charging and monitoring circuit of the built-in battery (10) (with a capacity of 3500 mAh); switching and indication circuit, which ensures switching on the device and provides indicators showing its operation.

The shielding box with a built-in ultrasonic suppressor of sound recording equipment (such as microphones built into the smartphones, smart watches, headphones, voice recorders) has a power of at least 105 dB (measured at a distance of 1 m) and is designed with the following technical characteristics:

Shielding efficiency: At least 60 dB in the frequency range of 30 MHz-6 GHz;

Ultrasonic protection against covert sound recording with 89% suppression efficiency at a distance of no more than 0.5 m from the sound recording equipment.

1) The created product provides the following key advantages:

Ease of use;

Passive shielding of all types of communication carried out via radio channels;

Autonomous ultrasonic suppressor of microphones;

Robustness, reliability, and durability of the design.

The shielding box blocks radio signals based on Faraday Cage principle with a shielding efficiency of at least 60 dB at the frequency range of 30 MHz-6 GHZ and for the following interfaces:

a) GPS/GLONASS;

b) GSM/3G/4G/5G;

c) Wi-Fi (2.4 GHz/5 GHZ);

d) Bluetooth;

e) NFC.

The shielding box with built-in ultrasonic suppressor of sound recording equipment uses ultrasonic suppression to block sound recording devices (microphones of smartphones, voice recorders, and smart watches) placed in a screening capsule.

The shielding box with built-in ultrasonic suppressor of sound recording equipment protects information against eavesdropping with mobile electronic devices that have a microphone.

In an embodiment of the claimed technical solution, the body of the box has a built-in EMC filter for data and power transmission, which prevents interference through cable conductors or holes in the shield (box). The filter has USB-C input ports on the outside of the box and USB-C output ports on the inside of the box.

The shielding box with built-in ultrasonic suppressor of sound recording equipment allows to use ultrasonic radiation to block any microphone built into a device. By interfering with the device, amplification path of a the ultrasonic waves at a frequency of 24-26 kHz cause the microphone amplifier to switch into a non-linear mode, thereby making it impossible to record any useful signal (sound).

The power is supplied by a built-in battery of 3.7 V/3500 mAh.

The charging is provided using an AC220 V/DC 5V 2A adapter.

What is claimed is:

1. A shielded box including ultrasonic suppression of a sound recording path in an enclosed electronic device and the shielded box comprising:

a housing formed of two parts including an upper part comprising a lid and a lower part, wherein the housing parts of the body are sealed and electrically connected to each other via a copper spring strip, an ultrasonic microphones suppressor arranged as a separate enclosure and disposed inside the shielded box, wherein the ultrasonic suppressor comprises at least three channels, with each channel containing an ultrasonic generator configured to generate an ultrasonic wave having a carrier frequency in a range of 24-26 kHz modulated by a signal having a frequency in a range of 100-500 Hz, and an ultrasonic emitters configured to emit the ultrasonic wave, wherein the ultrasonic emitters are arranged such that their radiation patterns are directed toward the electronic device placed inside the shielded box, thereby forming an ultrasonic field within the shielded enclosure that causes nonlinear distortions in a microphone amplification path of the electronic device and substantially degrades intelligibility of an audio signal recorded by the microphone.

2. The shielded box according to claim 1, wherein the ultrasonic suppressor of microphones in smartphones and voice recorders of the electronic device is an autonomous unit.

3. The shielded box according to claim 1, wherein the shielded box has a shielding efficiency of at least 60 dB in the frequency range of 30 MHz-6 GHz.

4. The shielded box according to claim 1, wherein it allows passive shielding of the following communication channels: global navigation satellite system (GNSS) signals, cellular communication signals, wireless local area network (WLAN) signals, short-range wireless communication signals, and near-field communication signals.

5. The shielded box according to claim 1, wherein the housing is made of an electrically conductive material with a current penetration depth of no more than 0.0026 mm at a frequency of 1 GHz with a wall thickness of at least 1.5 mm.

6. The shielded box according to claim 1, wherein its spring strip is fixed by a conductive glue or conductive adhesive tape.

7. The shielded box according to claim 1, wherein its copper spring strip is made in the form of profiled strip with spring-loaded lamellae.

8. The shielded box according to claim 1, wherein a plastic cup and/or an insert made from a sound-absorbing material is additionally installed within the housing.

9. The shielded box according to claim 8, wherein an acoustic membrane made of no more than 3 mm thick elastomeric or vibration-insulating material based on polyurethane is used as a sound-absorbing material.

10. The shielded box according to claim 1, wherein the housing has a built-in EMC filter for data and power transmission, wherein the filter has USB-C input ports on the outside of the box and USB-C output ports on the inside of the box.

11. The shielded box according to claim 1, wherein the ultrasonic suppressor of microphones in smartphones and voice recorders of the electronic device additionally includes a wireless charging transmitter with a wireless charging controller and induction transmission coil connected to the said wireless charging controller.

* * * * *